United States Patent [19]

Atallah et al.

[11] Patent Number: 4,823,095

[45] Date of Patent: Apr. 18, 1989

[54] REMOTE CONNECTION OF TERMINATION NETWORK

[75] Inventors: Francois I. Atallah, Raleigh, N.C.; Paul W. Bond, West Hurley; Denise E. Frey, Vestal, both of N.Y.

[73] Assignee: International Business Machines Corporation, Armonk, N.Y.

[21] Appl. No.: 115,454

[22] Filed: Oct. 30, 1987

[51] Int. Cl.[4] .......................... H03H 7/00; H03H 7/38

[52] U.S. Cl. ...................................... 333/22 R; 333/27

[58] Field of Search ........................................ 333/2–4, 333/22 R, 24 R, 27, 32; 455/14, 73, 79, 80

[56] References Cited

U.S. PATENT DOCUMENTS 2,034,026 3/1936 Curtis et al. ............................ 333/4

2,135,037 11/1938 Landon ............................. 333/27 X 2,268,664 1/1942 Landon .............................. 333/4 X

*Primary Examiner*—Paul Gensler

*Attorney, Agent, or Firm*—J. Dennis Moore; Robert L. Troike

[57] ABSTRACT

An improved dual media transceiver for terminating an electrical transmission line wherein the transmission line may be a coaxial cable or a shielded twisted pair line. A length of shielded twisted pair line is provided for interconnection. A connector for receiving the transmission line is also provided, adapted to connect the twisted pair wires of the transmission line to a first end of the twisted pair wires of the interconnection line when the transmission line is twisted pair line, and, when the transmission line is coaxial cable, adapted to connect a center conductor of the transmission line to one of the twisted pair wires, at the first end, and the shield of the transmission line to the shield of the interconnection line at the first end. A center tap termination network is connected to the second end of the interconnection line, having a center tap port connected to the shield of the line. The twisted pair wires of the line are connected to the non-center tap ports of the termination network. The network has electrical elements selected and arranged so as to provide a balanced or unbalanced impedance, as the case may be, at substantially the matching value, to the interconnection line whether the transmission line is coaxial or twisted pair wires.

3 Claims, 2 Drawing Sheets

REMOTE CONNECTION OF TERMINATION NETWORK

BACKGROUND OF THE INVENTION

1. Field of the Invention

The present invention relates to a dual media connector/termination network system providing proper termination impedance in both a single center connector coaxial cable mode and a twisted pair wire mode, and more particularly relates to means for remotely connecting the electrical termination network portion thereof from the mechanical connectors portion thereof.

2. Background Art

A novel dual media transceiver connector/termination network system is disclosed in IBM Technical Disclosure Bulletin, Vol. 29, No. 1 (June 1986), pp. 185–186. This circuit offers the significant benefit of permitting the transmission and reception of data without a balun on either a coaxial or a twisted pair cable. One requirement of that system is that the termination network be located physically close to the connector. A problem arises when the connector must be located physically remotely from the termination network, since connecting the connector jack to the termination network by a length of cable would introduce a fixed impedance level that is not compatible with the dual media system impedance requirements.

Accordingly, a solution is needed to permit the remote location of the connector from the termination network in such a dual media transceiver connector system. The present invention provides such a solution.

SUMMARY OF THE INVENTION

According to the present invention, an apparatus is provided that changes the impedance and balance offered as termination in a dual media transceiver connector system, so as to match the impedance of either coaxial or twisted pair transmission line connected to the connector, as the case may be. According to the present invention a length of shielded twisted pair line is provided for providing interconnection. A connector is also provided for receiving the transmission line, that is adapted to connect the twisted pair wires of the transmission line to a first end of the twisted pair wires of the interconnection line when the transmission line is twisted pair line, and, when the transmission line is coaxial cable, adapted to connect a center conductor of the transmission line to one of the twisted pair wires, at the first end, and the shield of the transmission line to the shield of the interconnection line, at the first end. A center tapped termination network is connected to the second end of the interconnection line, having a center tap port connected to the shield thereof. The twisted pair wires of the interconnection line are connected to the non-center tap ports of the termination network. The electrical elements of the termination network are selected and arranged so as to present a balanced or unbalanced impedance, as the case may be, at substantially the matching value, to the interconnection line whether the transmission line is coaxial or twisted pair wires.

Thus, through the switching action of the connector the proper impedance and balance are provided by way of the shielded twisted pair interconnection line, so as to permit either coaxial cable or shielded twisted pair line to be connected, even though the connector and the termination network may be remotely located from one another.

DETAILED DESCRIPTION OF THE PREFERRED EMBODIMENT

Figure 1:
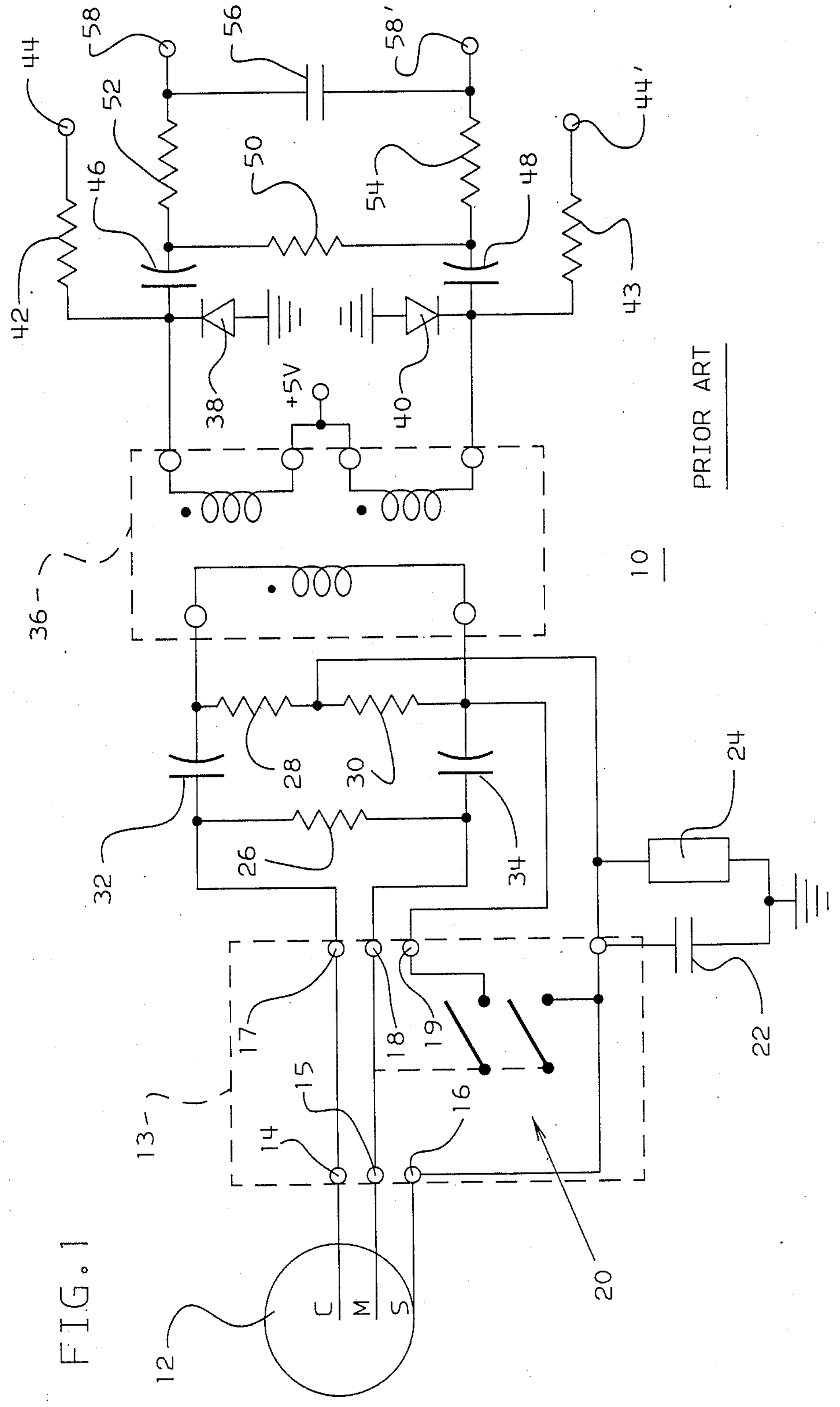
FIG. 1 is a diagram of a prior art dual media transceiver.

FIG. 1 is a diagram of a variation on the dual media transceiver disclosed in the aforementioned Technical Disclosure Bulletin. A transmission cable 12, which may be either shielded twisted pair or coaxial cable, is connected to a special dual mode jack, such as is disclosed in U.S. patent application Ser. No. 06/740,374, filed May 31, 1985. This connector 13 has three input ports 14, 15, 16, and three output ports 17, 18, 19. A double pole double throw switch 20 operates as shown, depending upon whether the connector 13 receives a twisted pair plug or a coaxial plug. Note that switch 20 performs substantially the same function as switches S1 and S2 in the aforementioned Technical Disclosure Bulletin.

The input network comprising resistors 26, 28 and 30, and capacitors 32, 34, perform substantially the same function as the input network of the dual media transceiver disclosed in the aforementioned Technical Disclosure Bulletin, but is a simplification thereof. This network is connected to a transformer 36, substantially the same as transformer 16 of the aforementioned Technical Disclosure Bulletin, the secondary of which is center tapped and connected to +5 Volts. Diodes 38 and 40 perform substantially the same functions as diodes D1 and D2 in the aforementioned Technical Disclosure Bulletin, and resistors 42 and 43 perform substantially the same functions as resistors R1 and R2 of the aforementioned Technical Disclosure Bulletin, ports 44 and 44' being connected to a driver (not shown). The network comprising resistors 50, 52, and 54, and capacitors 46, 48 and 56, perform the function of the band pass filter 14 of the aforementioned Technical Disclosure Bulletin, ports 58 and 58' being connected to a receiver (not shown). As in the aforementioned Technical Disclosure Bulletin, symbols C, M and S correspond to center conductor, middle conductor and shield. In twisted pair mode C and M represent twisted pair wires, while in coaxial mode, the center conductor is represented by C. Capacitor 22 operates in parallel with metal oxide varistor 24 to provide additional lightning protection not shown in the aforementioned Technical Disclosure Bulletin.

Note that the primary difference between the connector-termination system shown in FIG. 1 and the system shown in the aforementioned Technical Disclosure Bulletin is that the system shown in the aforementioned Technical Disclosure Bulletin is DC grounded, while the system shown in FIG. 1 is not. These could be networks on either end of the transmission line, it having been discovered that it is desirable to have at least one end of a length of transmission line DC grounded in order to avoid the buildup of electric charge, and the consequent danger to circuitry from discharge.

To summarize the function of the system shown in FIG. 1, resistors 26, 28 and 30, and switch 20 in the connector 13, permit the change of impedances to match the cable in use. When the connector 13 is mated with the twisted pair plug, ports 17 and 18 are connected to the twisted pair cable, and the shield is connected to the case. In this mode, resistor 26 is in parallel with resistors 28 and 30, and in parallel with the impedance of the circuitry including transformer 36 and the components and elements to the right thereof in the figure.

In general, the resistors and capacitors to the right of the transformer in FIG. 1 will be selected in order to provide the proper impedance matching with respect to the receiver and driver (both not shown) and to provide the appropriate band pass shaping desired. The considerations involved in this selection are well known to circuit designers of ordinary skill in this art. In this example, the selection of these components resulted in an impedance being offered at the single winding input to transformer 36 of 512 ohms. As the impedance of the twisted pair cable 12 and the coaxial cable 12, respectively, being terminated are 150 ohms and 93 ohms, respectively, the following values were selected so as to provide the appropriate impedance termination in this example. Resistor 26 is 2.0 kilohms, resistors 28 and 30 are each 124 ohms. Capacitors 32 and 34 are 0.05 microfarad. 22 is 0.1 microfarad. Appropriate wattage and voltage values were selected for the particular power and voltage demands being made, and desired lightning protection. The above selected resistances for resistors 26, 28 and 30 result in a total impedance of the parallel combination of 150 ohms being offered to the twisted pair wires.

When connector 13 is mated with a coaxial plug, port 17 is connected to the center conductor C. The middle conductor, M, shield, S, and case of the connector 13 are all connected together. In this mode, resistor 26 is in parallel with resistor 28, and in parallel with the impedance being offered at the single winding side of transformer 36, resulting in an impedance of 93 ohms, thus matching the impedance of the coaxial cable, as is desired.

It will be appreciated that given the operation of the circuit shown in FIG. 1, just described, a user cannot disturb the impedance matching by simply inserting an extra length of cable, and is thus limited to having the termination network close to the connector 13.

Figure 2:
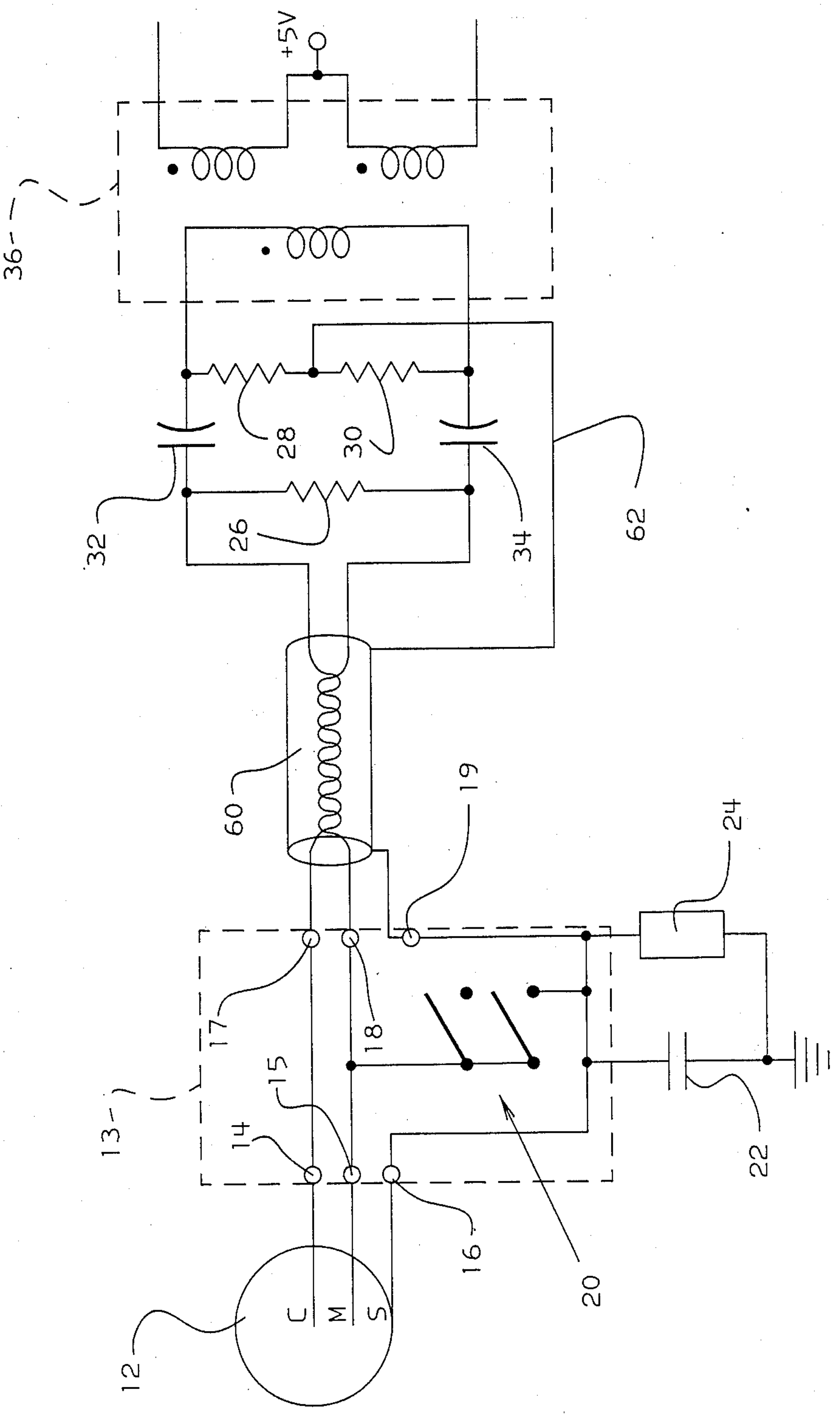
FIG. 2 is a diagram of a dual media transceiver according to the preferred embodiment of the present invention.

FIG. 2 is a diagram showing the preferred embodiment of the present invention, in which a length of shielded, twisted pair cable 60 is provided as an intermediate connection between the connector 13 and the termination circuitry to the right of the figure. Note that in this system, port 19 is connected to the shield of intermediate cable 60, as shown. At the other end of cable 60, the shield is connected to the center tap line 62.

Intermediate cable 60 has the physical characteristics shown in Table 1.

TABLE I

| Physical Characteristics of Shielded Twisted Pair Cable | |
|---|---|
| Outside diameter: | 6 +/− 0.75 mm |
| Conductor Pair: | |
| Material: | Commercially pure fully annealed copper |
| No. of Conductor Pairs: | 1 |
| Wire Size: | No. 26 AWG (stranded) (7 × 34 AWG) |
| Diameter: | 0.49 +/− .03 mm |
| D.C. Resistance: | <49 ohms/304.8M nom @ 20 degrees C. |

TABLE I-continued

| Physical Characteristics of Shielded Twisted Pair Cable | |
|---|---|
| Conductor Pair Insulation: | |
| Material: | Low density foamed crosslinked polyethelene |
| Insul. Wall Thickness: | 0.584 +/− 0.11 mm |
| Wire Diameter: (including insulation) | 1.75 +/− 0.25 mm |
| Pair Assembly: | |
| Lay (twist): | 15.24 cm maximum |
| ELECTRICAL CHARACTERISTICS: | |
| Characteristic Impedance: | 150 +/− 10% ohms at 2 MHZ<br>150 +/− 10% ohms at 4 MHZ |
| Attenuation: | <31 db/Km at 2 MHZ<br><44 db/Km at 4 MHZ |
| Capacitive Unbalance: | ≦1500 pf/Km @ 1 KHZ |
| OUTER JACKET: | |
| Material: | PVC |
| Wall Thickness: | 0.889 nominal<br>0.762 minimum average |

Note that the characteristic impedance of cable 60 is 150 ohms. However, the dimensions and parameters of cable 60 have been selected such that when one of the twisted pair wires is connected to the shield of the cable, and the other wire is used as the center conductor of the wire in a coaxial mode, the impedance of the cable in this configuration is 93 ohms.

The connections shown in FIG. 2 permit the change of impedances to match the particular cable in use, whether it be 150 ohm twisted pair or 93 ohm coax. When the connector 13 is mated with the twisted pair plug, ports 17 and 18 are connected to the twisted pair cable, and the shield is connected to the case. In this mode, resistor 26 is in parallel with resistors 28 and 30, and in parallel with the impedance offered by the single winding side of transformer 36, 512 ohms. The total impedance of the parallel combination is 150 ohms, as before. In addition, intermediate cable 60 is operating as a twisted pair transmission line having an impedance of 150 ohms. As the overall system is terminating a cable 12 in twisted pair mode having an impedance of 150 ohms, the proper impedance and balance is presented.

When operated in coaxial mode, terminating a cable 12 having an impedance of 93 ohms, the mating of a coaxial plug with connector 13 causes switch 20 to short port 18 to the connector 13 case, causing it to be connected via port 19 to the shield of cable 60. In this mode, resistor 26 is in parallel with resistor 28, and the impedance offered by the single winding side of transformer 36, resulting, as before, in a termination impedance of 93 ohms. In addition, as described above, the impedance, in this coaxial mode, of the intermediate length of cable 60 is 93 ohms. Thus, the proper impedance and balance is presented in this coaxial mode as well.

As shown above in connection with the preferred embodiment, the present invention permits the user to remotely locate a connector from a termination network when using a dual mode operation. This solves the problem presented in the prior art.

It is possible to use variations in the particular termination network configuration, provided that the appropriate impedance is offered at the proper balanced or unbalanced condition, as desired. In addition, it is also possible to match different impedance values than the particular values that were matched in the preferred embodiment of the present invention described hereinabove.

The impedance for a shielded twisted pair of line may be determined approximately by the following equation $$Z_o = (1/\pi)(\sqrt{\mu/\epsilon})(\text{COSH}^{-1}(D/2A))$$

A=radius of the wires,

D=distance between the wires (center to center), $\epsilon$=dielectric constant of the wire insulation, and $\mu$=permetivity of the insulation.

When using shielded twisted pair wire in coaxial mode, by connecting one of the wires to the shield of the line, as described above, in order to provide desired impedances potentially different from those used in the preferred embodiment herein, it is believed that the major parameter affecting the impedance offered in coaxial mode is the distance of the twisted pair wires from the shield. This distance is believed to have very little effect on the impedance of the line in twisted pair mode, and thus offers a reasonable parameter to adjust in arriving at a shielded twisted pair line having the appropriate impedances.

The amount of twisting per unit length is believed to have a relatively small effect on the impedance in either mode. Varying the radius of the wire will have an effect on both the impedance of the twisted pair mode and the coaxial mode, and is therefore probably a less convenient parameter to vary in deriving a cable having the desired combination of impedances.

Thus, while the invention has been described with reference to preferred embodiments thereof, it will be understood by those skilled in the art that various changes in form and details may be made without departing from the scope of the invention.

We claim:

1. An improved apparatus for terminating an electrical transmission line wherein said electrical transmission line comprises an insulated pair of electrical conductors within a shield capable of being connected to a dual mode jack for in one mode operating said transmission line as a coaxial line with one of the pair of electrical conductors grounded with said shield and in a second mode operating as a balanced pair line with only the shield grounded, comprising:

a length of interconnection line including a shield and a pair of conductors within a said shield and having a first end and a second end;

connector means including switch means, said connector means connecting the pair of conductors of said transmission line to said pair of conductors of said interconnection line at said first end, connecting the shield of said transmission line to the shield of said interconnection line and when said transmission line is operated as a coaxial cable connecting via said switch means that one of said pair of conductors of said interconnection line that is connected to said one of said pair of electrical conductors of said transmission line along with said shield to ground; and a center tapped termination network connected to said second end of said interconnection line, having a center tap connected to the shield thereof, and said pair of conductors of said interconnection line connected to the non-center tapped ports of said termination network, and having electrical elements selected in a range, so as to present a balanced or unbalanced impedance, as the case may be at substantially the matching value, to said interconnection line whether the transmission line is in a first or second mode.

2. Apparatus according to claim 1 wherein said termination network comprises a pair of resistors having a common point of connection comprising said center tap port, in parallel with said interconnection line and a transformer coupling said resistors and interconnection line to a receiver or driver, or both, wherein the values of said resistors are substantially equal and selected so that when both said resistors are in parallel with the impedance presented by said transformer the total impedance substantially matches the impedance of the interconnection line in balance pair mode, and when only one of said resistors is in parallel with the impedance presented by said transformer the total impedance substantially matches the impedance of the interconnection line in coaxial mode.

3. Apparatus according to claim 2 further comprising means for capacitively coupling the conductors of said interconnection line to the input ports of said transformer.

* * * * *